(12) United States Patent
McLellan et al.

(10) Patent No.: US 6,737,755 B1
(45) Date of Patent: May 18, 2004

(54) BALL GRID ARRAY PACKAGE WITH IMPROVED THERMAL CHARACTERISTICS

(75) Inventors: Neil McLellan, Mid Levels (HK); Ming Wang Sze, New Territories (HK); Wing Keung Lam, Kowloon (HK); Kin-wai Wong, Chai Wan (HK)

(73) Assignee: Asat, Ltd., New Territories (HK)

( * ) Notice: Subject to any disclaimer, the term of this patent is extended or adjusted under 35 U.S.C. 154(b) by 0 days.

(21) Appl. No.: 10/322,661

(22) Filed: Dec. 19, 2002

Related U.S. Application Data

(63) Continuation-in-part of application No. 10/197,832, filed on Jul. 19, 2002.

(51) Int. Cl.[7] ............................................. H01L 23/28
(52) U.S. Cl. ........................ 257/796; 257/675; 257/777
(58) Field of Search .................................. 257/777, 782, 257/675, 796, 784, 787

(56) References Cited

U.S. PATENT DOCUMENTS

| | | | | |
|---|---|---|---|---|
| 5,329,423 A | * | 7/1994 | Scholz | 361/760 |
| 5,435,732 A | * | 7/1995 | Angulas et al. | 439/67 |
| 5,610,442 A | * | 3/1997 | Schneider et al. | 257/787 |
| 5,736,785 A | | 4/1998 | Chiang et al. | 257/712 |
| 5,877,552 A | | 3/1999 | Chiang | 257/706 |
| 5,898,219 A | * | 4/1999 | Barrow | 257/713 |
| 5,901,043 A | * | 5/1999 | Lin et al. | 361/707 |
| 5,977,626 A | * | 11/1999 | Wang et al. | 257/707 |
| 5,985,695 A | * | 11/1999 | Freyman et al. | 438/112 |
| 6,016,013 A | * | 1/2000 | Baba | 257/778 |
| 6,075,712 A | * | 6/2000 | McMahon | 361/783 |
| 6,175,161 B1 | * | 1/2001 | Goetz et al. | 257/780 |
| 6,181,569 B1 | * | 1/2001 | Chakravorty | 361/761 |
| 6,388,335 B1 | * | 5/2002 | Lam | 257/778 |
| 6,462,405 B1 | * | 10/2002 | Lai et al. | 257/675 |

* cited by examiner

*Primary Examiner*—Jasmine Clark
(74) *Attorney, Agent, or Firm*—Keating & Bennett, LLP

(57) ABSTRACT

An integrated circuit package is provided. The package includes a substrate having first and second surfaces and a plurality of conductive traces therebetween. A semiconductor die is mounted on the first surface of the substrate and an adapter disposed on the semiconductor die. A plurality of wire bonds connect the semiconductor die to ones of the conductive traces of the substrate, and an encapsulant encapsulates the wirebonds and a remainder of the semiconductor die. A heat spreader has a top portion in contact with the adapter and at least one sidewall extends from the top portion. At least a portion of the at least one sidewall is in contact with the substrate. A ball grid array is disposed on the second surface of the substrate, bumps of the ball grid array being in electrical connection with ones of the conductive traces.

14 Claims, 4 Drawing Sheets

BALL GRID ARRAY PACKAGE WITH IMPROVED THERMAL CHARACTERISTICS

CROSS REFERENCE TO RELATED APPLICATION

This is a continuation-in-part of U.S. patent application Ser. No. 10/197,832 entitled Improved Ball Grid Array Package, filed Jul. 19, 2002.

FIELD OF THE INVENTION

The present invention relates in general to integrated circuit packaging, and in particular to a ball grid array package with improved thermal dissipation.

BACKGROUND OF THE INVENTION

High performance integrated circuit (IC) packages are well known in the art. Improvements in IC packages are driven by industry demands for increased thermal and electrical performance and decreased size and cost of manufacture.

In general, array packaging such as Plastic Ball Grid Array (PBGA) packages provide a high density of interconnects relative to the surface area of the package. However, typical PBGA packages include a convoluted signal path, giving rise to high impedance and an inefficient thermal path which results in low thermal dissipation performance. With increasing package density, the spreading of heat generated by the device is increasingly important.

Reference is made to FIG. 1 which shows an elevation view of a conventional PBGA package indicated generally by the numeral 20. The PBGA package 20 includes a substrate 22 and a semiconductor die 24 attached to the substrate 22 by a die adhesive. Gold wire bonds electrically connect the die 24 to metal traces on the substrate 22. The wire bonds and die 24 are encapsulated in a molding compound 26. Solder balls 28 are disposed on the bottom surface of the substrate 22 for signal transfer. Because of the absence of a thermal path away from the semiconductor die, thermal dissipation in this package is very poor.

One method of improving heat dissipation is the addition of thermal vias in the substrate. The thermal vias connect the die 24 to some of the solder balls 28 for heat dissipation. While these thermal vias are advantageous for thermal dissipation, the thermal vias are small and increased thermal dissipation in high density packages is still desirable.

Variations to conventional BGA packages have been proposed for the purpose of increasing thermal and electrical performance. FIG. 2 shows an elevation view of a PBGA package of the prior art with a heat sink 30. The heat sink 30 is comprised of a metal plate added to the upper portion of the package 20 for dissipating heat from the upper surface of the package 20. This package still suffers disadvantages, however, as heat must be dissipated from the silicon die 24, first through the molding compound 26 and then through the heat sink 30. Thus, heat dissipation away from the silicon die 24 in high density packages is still poor.

FIG. 3 shows an elevation view of yet another variation of the conventional BGA package according to the prior art. This package 20 includes a metal heat spreader 32 that is employed to dissipate heat from the semiconductor die 24 to the surrounding environment. The metal heat spreader 34 includes four legs 36, one leg at each corner. The legs 36 contact ground pads on the substrate 22, thereby providing four contact points with the ground pads. While this package provides better thermal dissipation than the package of FIG. 1, thermal dissipation is still poor and an improved thermal path from the semiconductor die is desirable.

Another example of a variation to conventional BGA packages is described in U.S. Pat. No. 5,977,626, issued Nov. 2, 1999, the contents of which are incorporated herein by reference. The '626 patent discloses a PBGA package having a metal heat spreader in contact with an upper surface of the semiconductor die and ground pads on the substrate. The heat spreader is added to dissipate heat from the semiconductor die to the surrounding environment. These packages also suffer disadvantages, however. One particular disadvantage is that the heat spreader and semiconductor die have significantly different thermo-mechanical properties causing induced stress on the semiconductor die during thermal cycling.

It is therefore an object of an aspect of the present invention to provide a BGA package with enhanced thermal properties.

SUMMARY OF THE INVENTION

In one aspect of the present invention, an integrated circuit package is provided. The package includes a substrate having first and second surfaces and a plurality of conductive traces therebetween. A semiconductor die is mounted on the first surface of the substrate and an adapter disposed on the semiconductor die. A plurality of wire bonds connect the semiconductor die to ones of the conductive traces of the substrate, and an encapsulant encapsulates the wirebonds and a remainder of the semiconductor die. A heat spreader has a top portion in contact with the adapter and at least one sidewall extends from the top portion. At least a portion of the at least one sidewall is in contact with the substrate. A ball grid array is disposed on the second surface of the substrate, bumps of the ball grid array being in electrical connection with ones of the conductive traces.

In another aspect of the present invention, a process for manufacturing an integrated circuit is provided. The process includes: mounting a semiconductor die to a first surface of a substrate; wire bonding the semiconductor die to ones of conductive traces of the substrate; mounting an adapter on a portion of the semiconductor die; encapsulating the wire bonds and a remainder of the semiconductor die in an encapsulant; mounting a heat spreader on the adapter and the substrate such that a top portion of the heat spreader contacts the adapter and at least one sidewall which extends from the top portion and contacts the substrate; and forming a ball grid array on a second surface of the substrate, bumps of the ball grid array being electrically connected to the conductive traces.

Advantageously, a material with high thermal conductivity and similar thermo-mechanical properties to the semiconductor die is incorporated into the BGA package, and in contact with both the silicon die and a heat spreader on the upper surface of the package. Thus, the material has a coefficient of thermal expansion (CTE) and an elastic modulus similar to the semiconductor die and provides a thermal conduction path to the surface of the package. Also, heat distribution is enhanced throughout the whole package by increasing the contact between the heat spreader and the substrate.

In one aspect of the present invention, a glob-top encapsulation is used resulting in better wire sway control. Wire sway is the wire displacement during the encapsulation process. The glob-top material has a lower flow viscosity during encapsulation than the mold compound material, resulting in better wire sway control. Also, there is no phase change after the glob-top material is added.

BRIEF DESCRIPTION OF THE DRAWINGS

The present invention will be better understood with reference to the drawings and the following description in which.

DETAILED DESCRIPTION OF THE PREFERRED EMBODIMENTS

Figure 1:
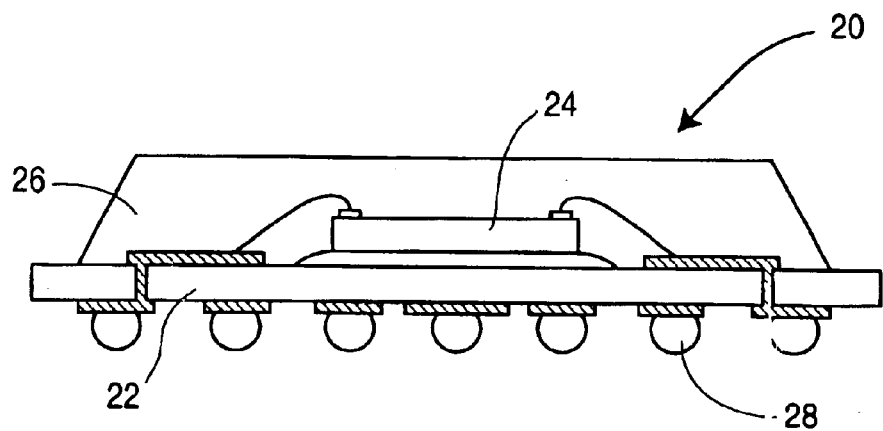
FIG. 1 shows an elevation view of a conventional plastic ball grid array package.
Figure 2:
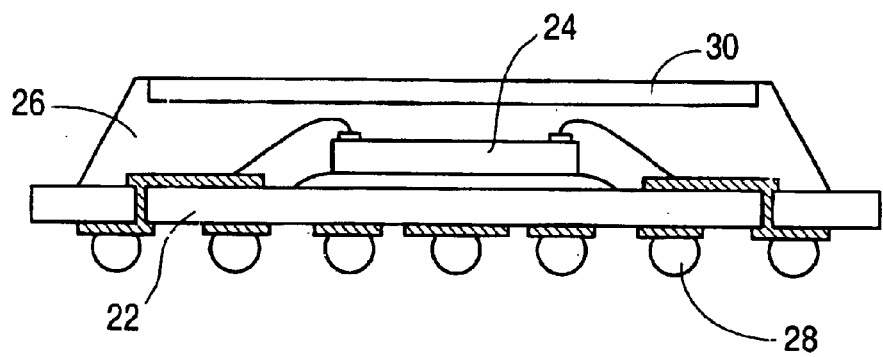
FIG. 2 shows an elevation view of a plastic ball grid array package with a heat sink, according to the prior art.
Figure 3:
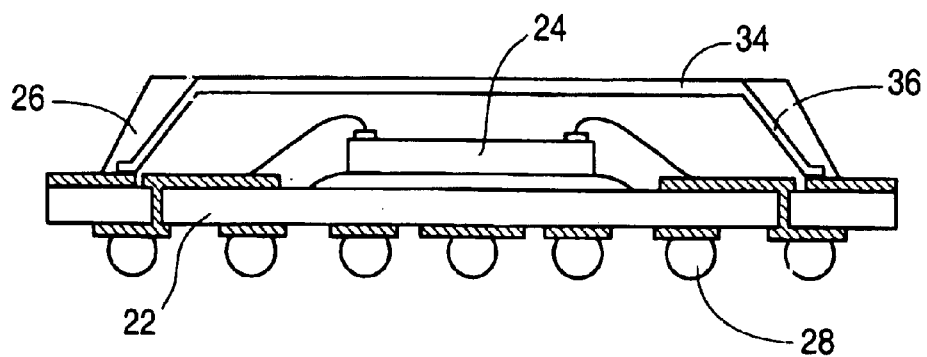
FIG. 3 shows an elevation view of a plastic ball grid array package with a heat spreader according to the prior art.

To simplify the description, the numerals used previously in describing FIGS. 1 to 3 will be used again after raising the numerals by 100 where the parts to be described correspond to parts already described.

Figure 4A:
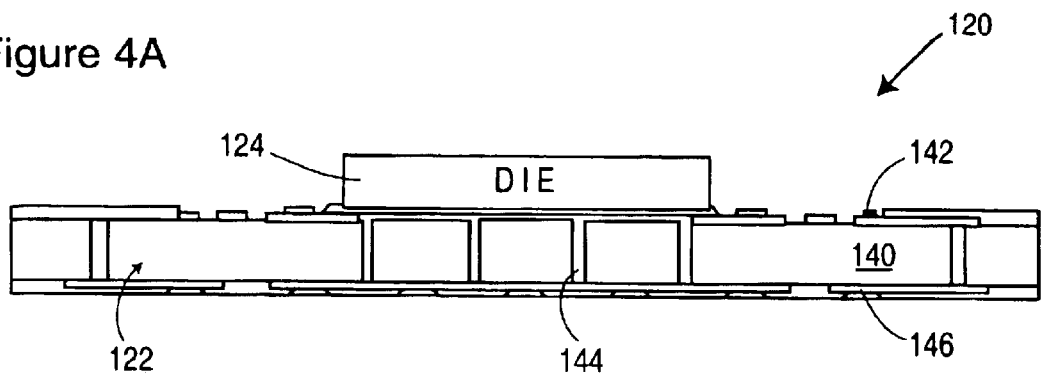
FIGS. 4A to 4F show the processing steps for manufacturing a ball grid array package with improved thermal characteristics, in accordance with an embodiment of the present invention.

Reference is now made to FIGS. 4A to 4F to describe the processing steps for manufacturing a ball grid array package with improved thermal characteristics, in accordance with one embodiment of the present invention. The ball grid array package 120 includes a substrate 122 of a BT resin/glass epoxy printed circuit board 140 with conductive traces 142 for signal transfer. Thermal vias 144 through the substrate 122 are provided under the position where the semiconductor die 124 is attached. A solder mask is located on the upper and lower surface of the substrate, with upper portions and lower portions 146 of the conductive traces (interconnects) exposed, as shown in FIG. 4A.

Figure 4B:
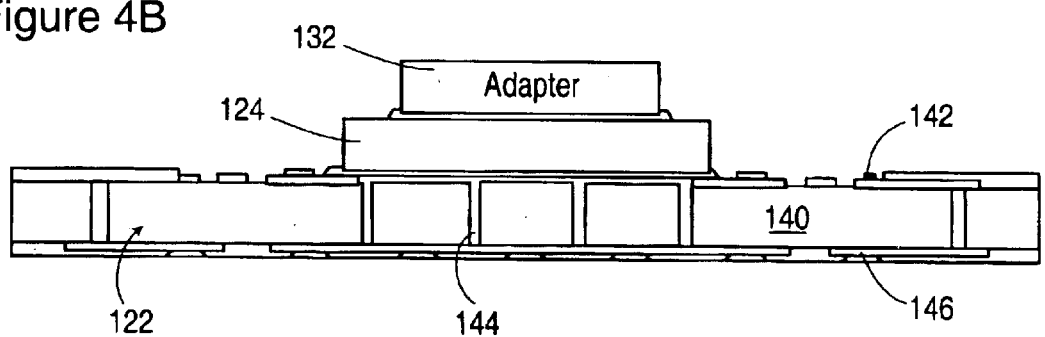

A singulated semiconductor die 124 is conventionally mounted to an upper surface of the substrate 122 using a die attach epoxy (FIG. 4A). Next, an adapter 132 is mounted to a portion of the top of the semiconductor die 124 for providing a thermal path away from the die 124 (FIG. 4B). In the present embodiment, the adapter 132 is silicon and is attached to the die 124 using an epoxy. Other suitable adhesive materials will occur to those skilled in the art.

Figure 4C:
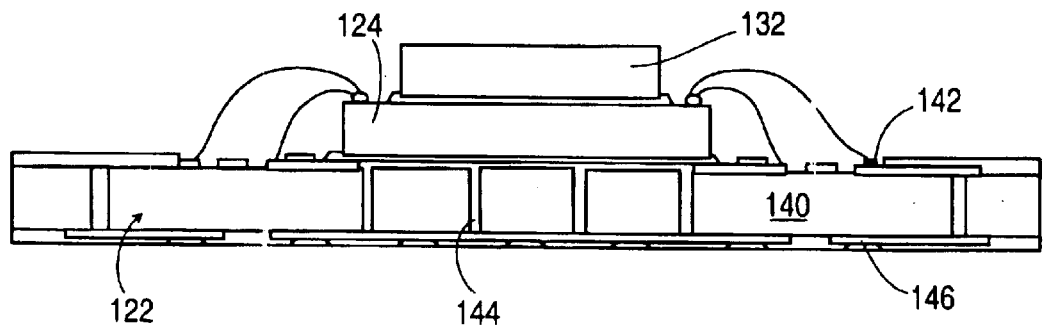

The semiconductor die 124 includes a conductive pad array formed thereon and gold wires are bonded between the conductive pads of the array and the conductive traces 142 on the substrate 122 using conventional wire bonding techniques (FIG. 4C).

Figure 4D:
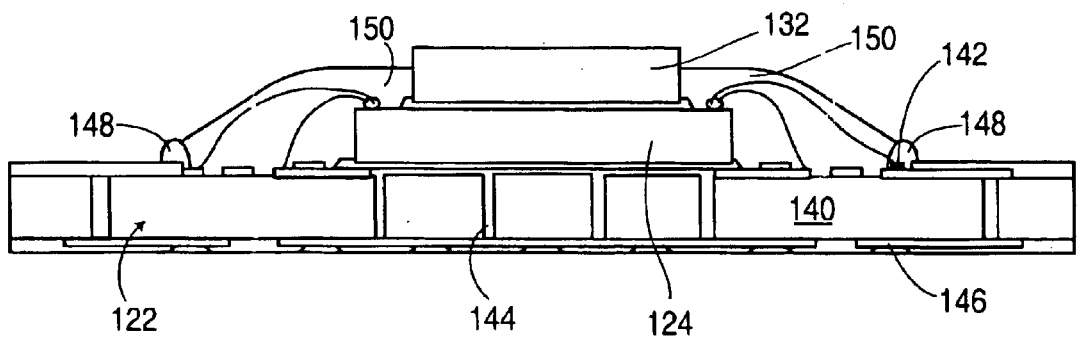

Next, an epoxy material is dispensed on the top surface of the substrate 122, around the semiconductor die 124 forming a liquid dam 148. The package is encapsulated using a glob-top material 150 (liquid epoxy) (FIG. 4D), as would be understood by those skilled in the art. The glob-top encapsulant 150 protects the wire bonds as well as the semiconductor die 124. As shown in FIG. 4D, the glob-top material 150 surrounds a lower portion of the adapter 132 such that the adapter 132 protrudes from the glob-top encapsulant 150.

Figure 4E:
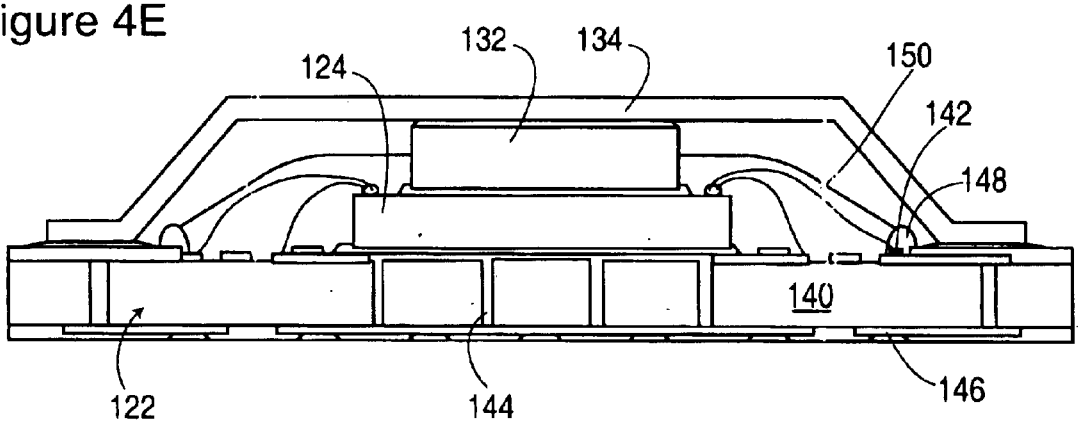

A heat spreader 134 is then fixed to both the top of the adapter 132 and to the upper surface of the substrate 122 using epoxy (FIG. 4E). It will now occur to those skilled in the art that the adapter 132 and the heat spreader 134 provide a thermal path away from the die 124 and to the top of the package 120.

Figure 4F:
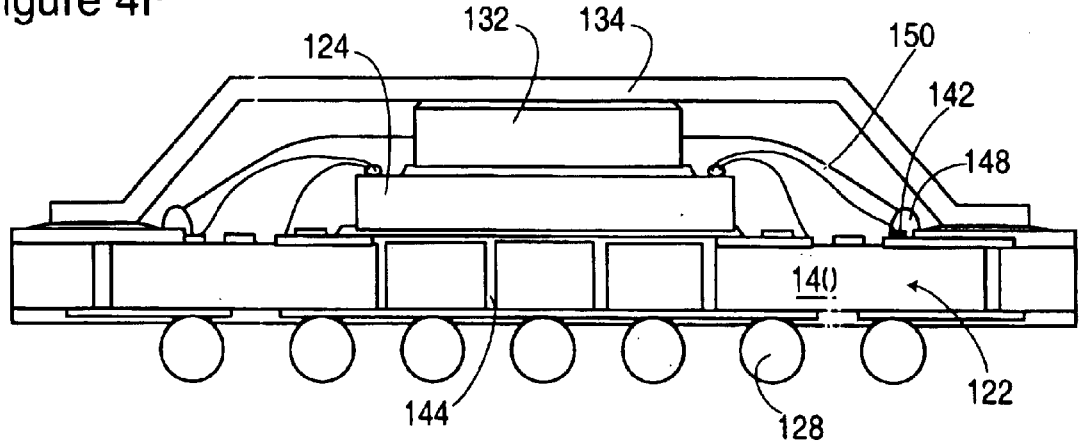

A ball grid array (BGA) of solder balls 128, also referred to as solder bumps, is formed on the bottom surface of the substrate 122 at the exposed portions 146 of the conductive traces (FIG. 4F). To attach the solder balls 128, a flux is added to the balls prior to placement and, after placement, the solder balls are reflowed using known reflow techniques. The solder balls 128 are thereby connected to the conductive traces 142 of the substrate 122 and through the gold wires, to the semiconductor die 124. The solder balls 128 provide signal and power connections as well as ground connections for the semiconductor die 124.

Figure 5:
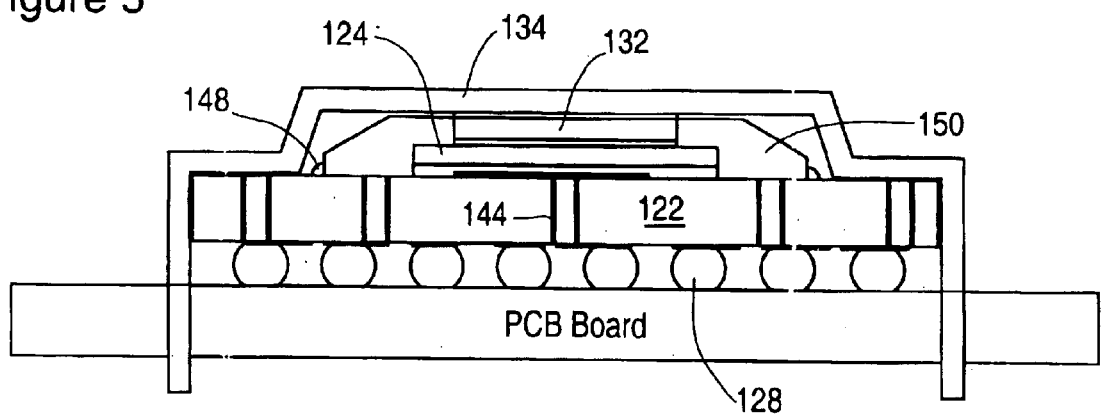
FIG. 5 shows a plastic ball grid array package with improved thermal characteristics, in accordance with an alternative embodiment of the present invention.

Reference is now made to FIG. 5 to describe a plastic ball grid array package with improved thermal characteristics, in accordance with an alternative embodiment of the present invention. As will be evident, the plastic ball grid array package is shown in FIG. 5 coupled to a printed circuit board of a computing device, for use. In this embodiment, the heat spreader 134 extends over the entire package 120 and is mounted to the printed circuit board of the computing device via through holes. This provides further thermal dissipation to further enhance thermal performance of the package.

Figure 6A:
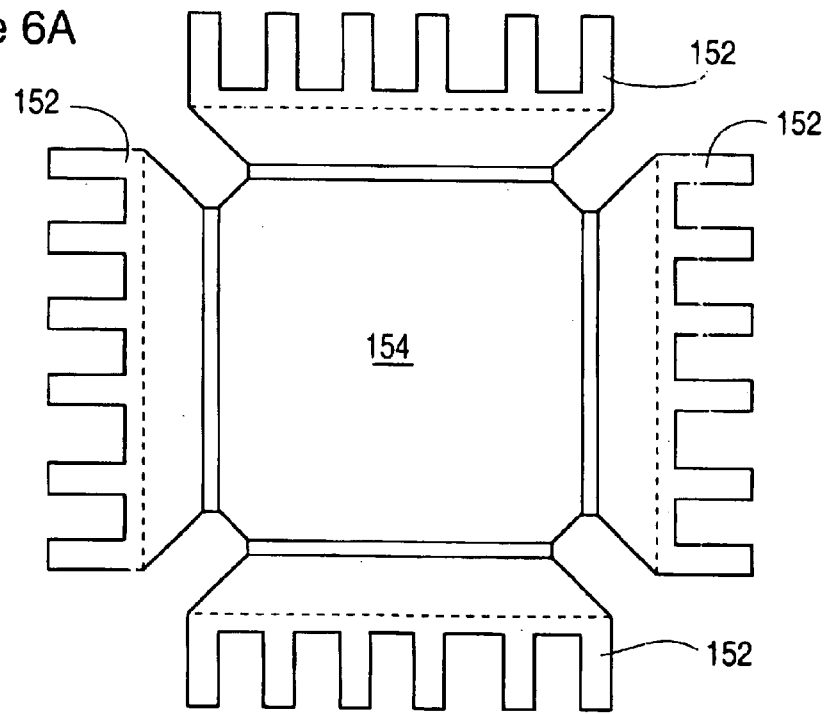
FIGS. 6A and 6B show an exemplary configuration of a suitable heat spreader for use in manufacturing the ball grid array package of FIG. 5.
Figure 6B:
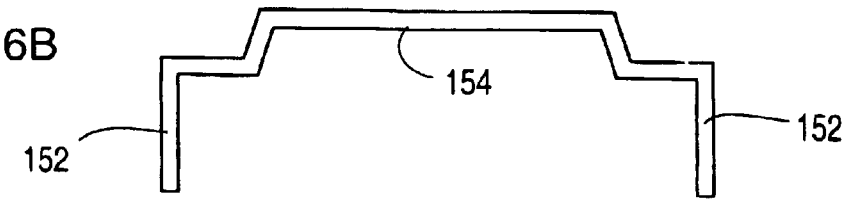

Referring to FIGS. 6A and 6B, one configuration of a suitable heat spreader 134 for use in manufacturing the plastic ball grid array package embodiment of FIG. 5, is shown. FIG. 6A is a top view of the heat spreader 134 with four sides 152 that are bent substantially perpendicular to the top portion 154 of the heat spreader 134. The bend lines are indicated in ghost outline in FIG. 6A. FIG. 6B shows a cross-sectional side view of the heat spreader 134, showing a pair of sides 152 bent substantially perpendicular to the top portion 154 for insertion into a printed circuit board computing device, as shown in FIG. 5.

Specific embodiments of the present invention have been shown and described herein. However, modifications and variations to these embodiments are possible. For example, other substrate materials and conductive metal or alloy traces are possible and will occur to those skilled in the art. The adapter material is not limited to silicon as other suitable materials can be used, including for example, copper and ceramic such as $Al_2O_3$. Also, other shapes of heat spreaders are possible. Those skilled in the art may conceive of still other modifications and variations, all of which are within the scope and sphere of the present invention.

What is claimed is:

1. An integrated circuit package comprising:

a substrate having first and second surfaces and a plurality of conductive traces therebetween;

a semiconductor die mounted on said first surface of said substrate;

an adapter disposed on said semiconductor die;

a plurality of wire bonds connecting said semiconductor die to ones of said conductive traces of said substrate;

an encapsulant for encapsulating said wirebonds and a remainder of said semiconductor die;

a heat spreader having a top portion in contact with said adapter and at least one sidewall extending from said top portion, at least a portion of said at least one sidewall in contact with said substrate; and a ball grid array disposed on said second surface of said substrate, bumps of said ball grid array being in electrical connection with ones of said conductive traces.

2. The integrated circuit package according to claim 1, wherein said adapter is a silicon adapter.

3. The integrated circuit package according to claim 1, wherein said encapsulant is a glob-top material.

4. The integrated circuit package according to claim 1, wherein said substrate further has at least one conductive via extending therethrough for conducting heat away from said semiconductor die.

5. The integrated circuit package according to claim 1, wherein said heat spreader comprises four sidewalls, each of said sidewalls being in contact with said substrate.

6. The integrated circuit package according to claim 5, wherein each of said sidewalls is fixed to said substrate.

7. The integrated circuit package according to claim 5, wherein each of said sidewalls contacts said substrate at more than one location.

8. The integrated circuit package according to claim 6 wherein said sidewalls extend and project from said second surface of said substrate.

9. A process for manufacturing an integrated circuit comprising:

mounting a semiconductor die to a first surface of a substrate;

wire bonding said semiconductor die to ones of conductive traces of said substrate;

mounting an adapter on a portion of said semiconductor die;

encapsulating the wire bonds and a remainder of said semiconductor die in an encapsulant;

mounting a heat spreader on said adapter and said substrate such that a top portion of said heat spreader contacts said adapter and at least one sidewall which extends from said top portion and contacts said substrate; and forming a ball grid array on a second surface of said substrate, bumps of said ball grid array being electrically connected to said conductive traces.

10. The process according to claim 9, wherein said mounting said adapter comprises mounting a silicon adapter to said portion of said semiconductor die.

11. The process according to claim 9, wherein said encapsulating the wire bonds comprises depositing a liquid dam material on a top surface of said substrate and encapsulating said wire bonds in a glob-top material.

12. The process according to claim 9, wherein said mounting a heat spreader comprises fixing a top portion of said heat spreader to said silicon adapter and fixing said at least one sidewall to the substrate.

13. The process according to claim 9, wherein said mounting a heat spreader comprises fixing a top portion of said heat spreader to said silicon adapter and fixing four sidewalls which extend from said top portion, to said substrate.

14. The process according to claim 13, wherein fixing said four sidewalls to said substrate comprises fixing each of said four sidewalks to more than one location of said substrate.

* * * * *